United States Patent
Tsuda

(10) Patent No.: US 12,495,551 B2
(45) Date of Patent: Dec. 9, 2025

(54) SEMICONDUCTOR DEVICE

(71) Applicant: Kioxia Corporation, Tokyo (JP)

(72) Inventor: Muneyuki Tsuda, Ichinomiya (JP)

(73) Assignee: Kioxia Corporation, Tokyo (JP)

( * ) Notice: Subject to any disclaimer, the term of this patent is extended or adjusted under 35 U.S.C. 154(b) by 1027 days.

(21) Appl. No.: 17/644,816

(22) Filed: Dec. 17, 2021

(65) Prior Publication Data

US 2023/0031132 A1 Feb. 2, 2023

(30) Foreign Application Priority Data

Aug. 2, 2021 (JP) ................... 2021-126615

(51) Int. Cl.
*H10B 43/27* (2023.01)
*H10B 41/27* (2023.01)
*H10B 41/35* (2023.01)
*H10B 43/35* (2023.01)

(52) U.S. Cl.
CPC ............ *H10B 43/27* (2023.02); *H10B 41/27* (2023.02); *H10B 41/35* (2023.02); *H10B 43/35* (2023.02)

(58) Field of Classification Search
None
See application file for complete search history.

(56) References Cited

U.S. PATENT DOCUMENTS

| | | |
|---|---|---|
| 9,230,979 B1 | 1/2016 | Pachamuthu et al. |
| 10,468,431 B2 | 11/2019 | Kim et al. |
| 2013/0009236 A1* | 1/2013 | Lee ............ H10B 41/20 257/329 |
| 2017/0092781 A1 | 3/2017 | Polishchuk et al. |
| 2018/0277567 A1 | 9/2018 | Nakamura et al. |
| 2018/0331119 A1* | 11/2018 | Kim ............ H10D 30/693 |
| 2019/0123060 A1* | 4/2019 | Wang ............ H10B 43/10 |
| 2020/0194450 A1* | 6/2020 | Pachamuthu ..... H01L 21/26513 |
| 2020/0273882 A1* | 8/2020 | Wang ............. H01L 21/02532 |

* cited by examiner

*Primary Examiner* — Nishath Yasmeen
(74) *Attorney, Agent, or Firm* — Oblon, McClelland, Maier & Neustadt, L.L.P.

(57) ABSTRACT

A semiconductor device according to an embodiment includes a plurality of conductive layers stacked apart from each other and extending in a plate shape in a direction crossing a stacking direction; a channel body including a semiconductor film and penetrating the plurality of conductive layers; a memory film including a charge accumulation film and provided between the plurality of conductive layers and the channel body; and a high dielectric constant (high-k) film arranged between the plurality of conductive layers and the memory film while being divided in a circumferential direction surrounding the memory film.

19 Claims, 15 Drawing Sheets

SEMICONDUCTOR DEVICE

CROSS-REFERENCE TO RELATED APPLICATION

This application is based upon and claims the benefit of priority from Japanese Patent Application No. 2021-126615 filed on Aug. 2, 2021 in Japan, the entire contents of which are incorporated herein by reference.

FIELD

Embodiments described herein relate generally to a semiconductor device.

BACKGROUND

In the development of semiconductor devices, particularly semiconductor storage devices, memory cells are being miniaturized to achieve larger capacity, lower cost, and the like. For example, a three-dimensional NAND flash memory device in which memory cells are arranged in a three-dimensional manner is being developed. In the three-dimensional NAND flash memory device, a NAND string in which memory cells are connected to each other in a direction perpendicular to the word line layer surface (so-called stacking direction) is formed in word line layers stacked with a dielectric layer interposed therebetween. In this manner, higher integration is achieved as compared with a case where memory cells are arranged in a two-dimensional manner. In the three-dimensional NAND flash memory device, when etching is performed to form a memory hole in stacked films, there is a problem that a portion locally etched in the circumferential direction, which is called a striation (vertical stripe portion), appears. As a result, in the circumferential direction of the memory cell, a portion where electric field concentration occurs locally may appear to deteriorate the cell characteristics.

DETAILED DESCRIPTION

A semiconductor device according to an embodiment includes a plurality of conductive layers, a channel body, a memory film, and a high dielectric constant (high-k) film. The plurality of conductive layers is stacked apart from each other and extends in a plate shape in a direction crossing a stacking direction. The channel body includes a semiconductor film and penetrates the plurality of conductive layers. The memory film includes a charge accumulation film and is provided between the plurality of conductive layers and the channel body. The high-k film is arranged between the plurality of conductive layers and the memory film while being divided in a circumferential direction surrounding the memory film.

Hereinafter, in embodiments, a semiconductor device capable of suppressing the deterioration of cell characteristics even when a striation appears will be described.

In addition, in embodiments, a three-dimensional NAND flash memory device will be described below as an example of the semiconductor device. Hereinafter, a description will be given with reference to the diagrams. In addition, in each diagram, the x, y, and z directions are perpendicular to each other, and the z direction may be described as an upper or upper layer direction and the opposite direction may be described as a lower or lower layer direction.

Embodiment 1

Figure 1:
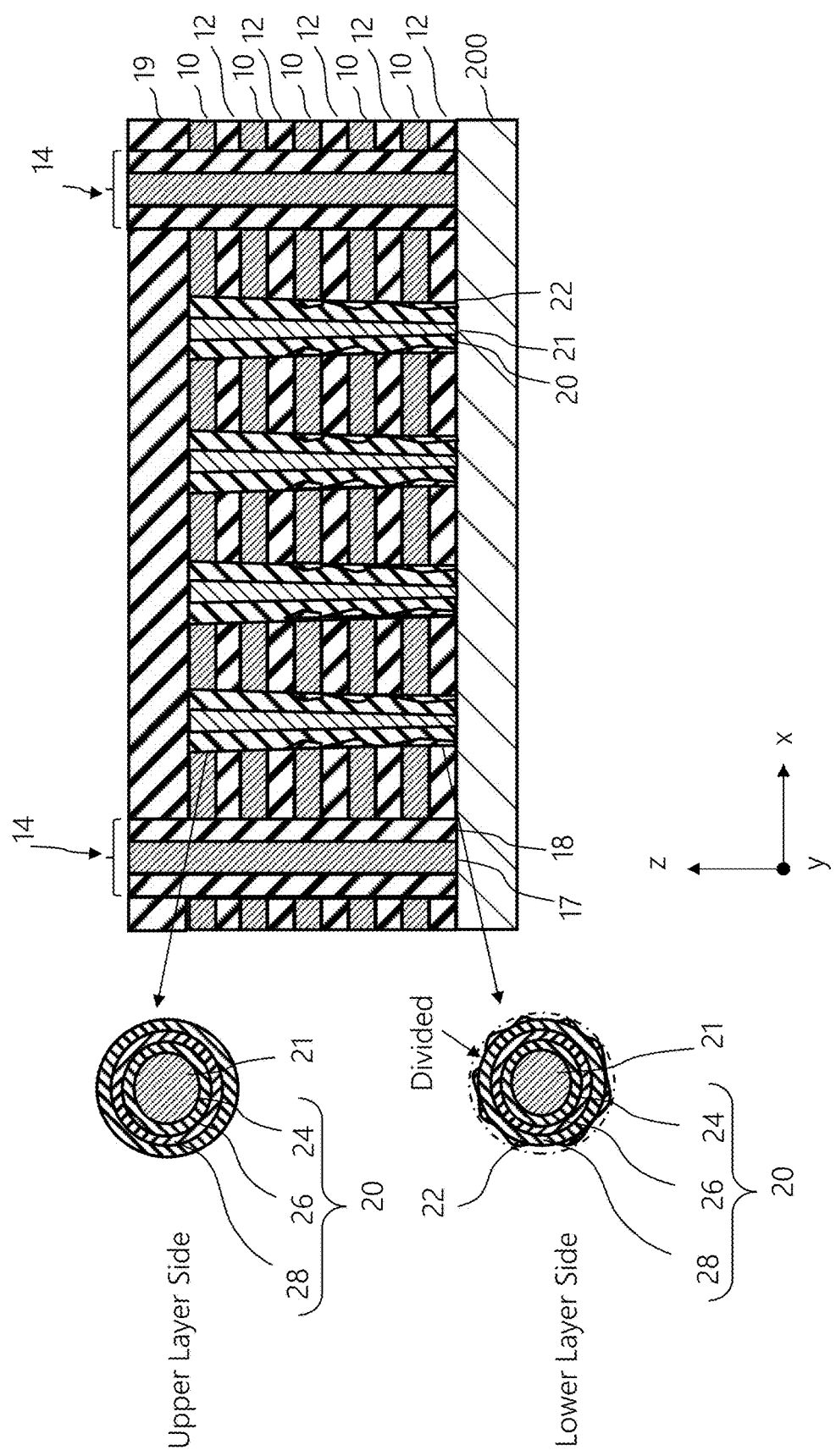
FIG. 1 is a cross-sectional view showing an example of the configuration of a semiconductor device according to Embodiment 1.

FIG. 1 is a cross-sectional view showing an example of the configuration of a semiconductor device according to Embodiment 1. In FIG. 1, in the semiconductor device according to Embodiment 1, a plurality of conductive layers 10 stacked apart from each other are arranged above a semiconductor substrate 200 (substrate). In addition, a plurality of dielectric layers 12 stacked apart from each other are arranged above the semiconductor substrate 200 (substrate). Each of the plurality of dielectric layers 12 is arranged between adjacent conductive layers 10 among the plurality of conductive layers 10. Therefore, a stacked body in which the conductive layer 10 and the dielectric layer 12 are alternately stacked is formed. The dielectric layer 12 of each layer insulates the adjacent conductive layers 10 from each other. The conductive layer 10 of each layer of the plurality of conductive layers 10 serves as a word line (WL) in the semiconductor storage device.

The conductive layer 10 of each layer is a plate-shaped layer extending in a first direction (y direction) crossing the stacking direction (z direction) of the plurality of conductive layers 10. In the example of FIG. 1, a case is shown in which each conductive layer 10 extends in a plate shape toward the back of the paper surface. In addition, in the example of FIG. 1, a memory cell area is shown. Hereinafter, a word line contact region is not shown in each diagram. In the example of FIG. 1, the dielectric layer 12 is first arranged on the semiconductor substrate 200, and the uppermost conductive layer 10 is covered with a dielectric film 19. The conductive layer 10 of each layer is separated from the adjacent conductive layer 10 by a separation groove 14, which is also used as a replacement groove in a replacement step described later, in a direction (x direction) perpendicular to the first direction that is a longitudinal direction of the plate-shaped conductive layer 10. In addition, the conductive layer 10 of each layer forms one block region between two separation grooves 14 adjacent to each other in the x direction. In the separation groove 14, a conductive member 17 is embedded between dielectric films 18 serving as spacers, for example. In addition, the side portion of the conductive member 17 is electrically separated from the conductive layer 10 of each layer by the dielectric film 18. In addition, a bottom portion of the conductive member 17 is electrically connected to the semiconductor substrate 200 to also function as a contact for a source line (SL) in the semiconductor storage device.

In addition, in the memory cell region shown in FIG. 1, a columnar channel body 21 that penetrates the stacked body, which is formed by the plurality of conductive layers 10 and the plurality of dielectric layers 12, in the stacking direction is arranged. Therefore, the channel body 21 penetrates the plurality of conductive layers 10 arranged in the stacking direction. The channel body 21 includes a semiconductor film extending in the stacking direction of the stacked body, and for example, silicon is used as a material of the semiconductor film. In addition, in the memory cell region, a memory film 20 including a charge accumulation film is arranged between each conductive layer 10 and the channel body 21. The memory film 20 is arranged in a cylindrical shape that penetrates the stacked body of the plurality of conductive layers 10 and the plurality of dielectric layers 12 in the stacking direction so as to surround the entire side surface of the channel body 21. Therefore, the memory film 20 is provided between the stacked body and the channel body 21. The memory film 20 includes a block dielectric film 28, a charge accumulation film 26, and a tunnel dielectric film 24 from the outside.

In addition, in Embodiment 1, a high dielectric constant (high-k) film 22 is arranged between the stacked body of the plurality of conductive layers 10 and the plurality of dielectric layers 12 and the memory film 20. The high-k film 22 is arranged between the plurality of conductive layers 10 and the memory film 20 while being divided in the circumferential direction surrounding the memory film 20. That is, the film thickness of the high-k film 22 changes depending on a position in the circumferential direction surrounding the memory film 20. In addition, the high-k film 22 has one or more portions divided in the circumferential direction surrounding the memory film 20.

Figure 2:
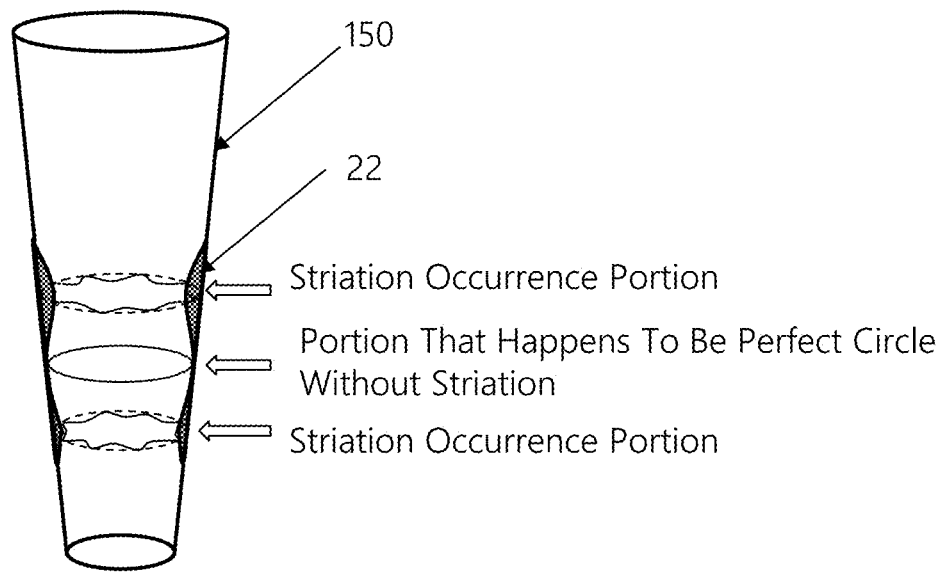
FIG. 2 is a diagram showing an example of the arrangement position of a high-k film in Embodiment 1.

FIG. 2 is a diagram showing an example of the arrangement position of a high-k film in Embodiment 1. When processing a memory hole 150 that penetrates the stacked body in the stacking direction, the occurrence rate of a striation tends to increase toward the lower layer. For this reason, for example, a portion where no striation occurs may appear on the upper layer side, and a portion where a striation occurs may appear on the lower layer side. In such a case, as shown in FIG. 1, the high-k film 22 located in the recess of the striation is not arranged on the upper layer side but is arranged on the lower layer side, for example. As a result, on the upper layer side, as shown in FIG. 1, a portion where the high-k film 22 is not provided is present over the entire circumferential direction surrounding the memory film 20.

However, as shown in FIG. 2, a portion where no striation occurs may appear between portions where the striation occurs in the z direction. In this case, the cross section of the memory hole 150 in such a portion is a substantially perfect circle, and the high-k film 22 is not present over the entire circumferential direction surrounding the memory film 20. In addition, the striation may also occur on the upper layer side. In such a case, the high-k film 22 is also arranged in the recess of the striation on the upper layer side.

Between each dielectric layer 12 and the conductive layer 10 adjacent thereto, for example, another high-k film such as an aluminum oxide film is interposed as will be described later. In addition, the aluminum oxide film is also formed between the memory film 20 or the high-k film 22 and each conductive layer 10. In FIG. 1, the aluminum oxide film is not shown. In addition, it is also preferable that, for example, a barrier metal film such as titanium nitride (TiN) (not shown) is interposed between each conductive layer 10 and the dielectric layer 12 adjacent thereto and between each conductive layer 10 and the memory film 20 or the high-k film 22.

At a position where the high-k film 22 is formed, one memory cell is formed by the combination of the conductive layer 10 serving as a word line, an aluminum oxide film (not shown) described later, the high-k film 22, the memory film 20, and the channel body 21 surrounded by the memory film 20. At a position where the high-k film 22 is not formed, one memory cell is formed by the combination of the conductive layer 10 serving as a word line, an aluminum oxide film (not shown) described later, the memory film 20, and the channel body 21 surrounded by the memory film 20.

In addition, a plurality of memory pillars including at least a plurality of channel bodies 21 and the memory film 20 surrounding each channel body 21 are arranged in the conductive layer 10 of one layer. In the example of FIG. 1, a case is shown in which four memory pillars formed by the channel body 21 and the memory film 20 are arranged in the width direction (x direction) of the word line (conductive layer 10) in one block region. Each memory cell is formed at a position where one memory pillar, among the plurality of memory pillars that penetrate the stacked body of the plurality of conductive layers 10 as described above, crosses the conductive layer 10 of each layer, and one NAND string is formed by a plurality of memory cells in which memory cells formed by the same memory pillar at the intersections with the conductive layers 10 are connected to each other. In addition, the conductive layer 10 on the lowermost layer side or the uppermost layer side of the plurality of conductive layers 10 may be used as a selection gate line (SG) in the semiconductor storage device, and a selection transistor may be provided at a position where the conductive layer 10 and the memory pillar cross each other.

One end of each channel body 21 is connected to a different bit line contact and a different bit line (not shown)

in a layer above the stacked body, for example. The other end of each channel body 21 is connected to the semiconductor substrate 200 as a common source region, for example, in a layer below the stacked body. In addition, each columnar channel body 21 may be formed to have a cylindrical structure in which a semiconductor film has a bottom portion, and a core portion using a dielectric material may be arranged in the columnar channel body 21.

Figure 3:
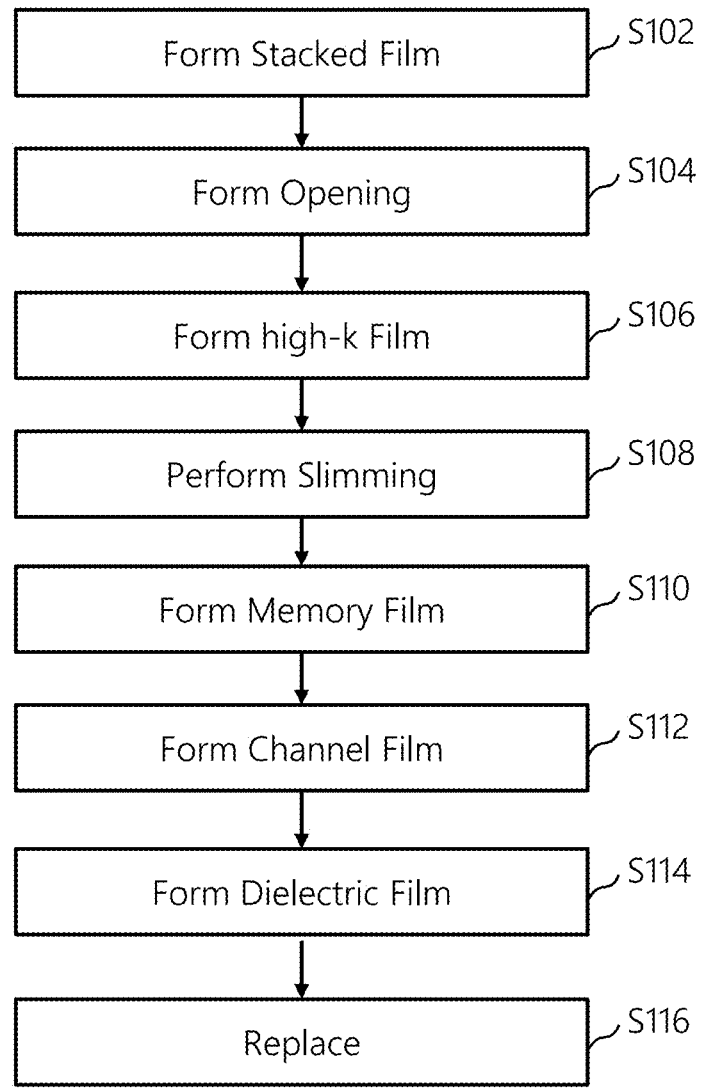
FIG. 3 is a flowchart showing main steps of a method for fabricating the semiconductor device according to Embodiment 1.

FIG. 3 is a flowchart showing main steps of a method for fabricating the semiconductor device according to Embodiment 1. In FIG. 3, in the method for fabricating the semiconductor device according to Embodiment 1, a series of steps of a stacked film forming step (S102), an opening forming step (S104), a high-k film forming step (S106), and a slimming step (S108), a memory film forming step (S110), a channel film forming step (S112), a dielectric film forming step (S114), and a replacement step (S116) are performed.

Figure 4:
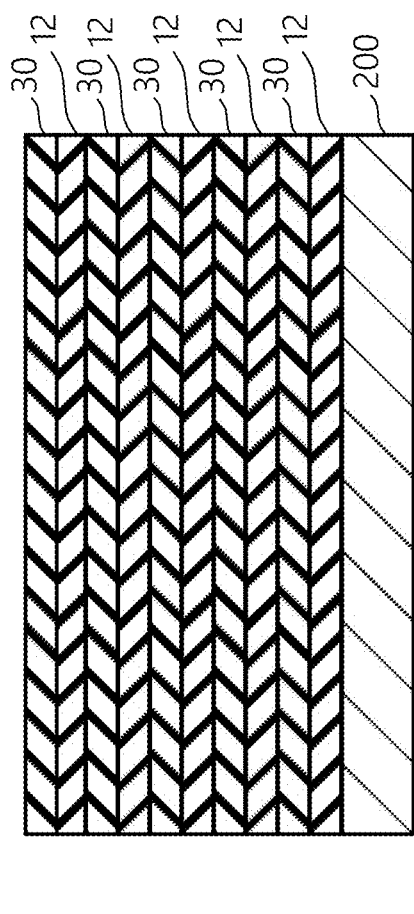
FIG. 4 is a cross-sectional view showing some of the steps of the method for fabricating the semiconductor device according to Embodiment 1.

FIG. 4 is a cross-sectional view showing some of the steps of the method for fabricating the semiconductor device according to Embodiment 1. FIG. 4 shows the stacked film forming step (S102) in FIG. 3. Subsequent steps will be described later.

In FIG. 4, as the stacked film forming step (S102), first, the dielectric layer 12 and a sacrificial film layer 30 are alternately stacked on the semiconductor substrate 200 by using, for example, an atomic layer deposition (ALD) or atomic layer chemical vapor deposition (ALCVD) method or a chemical vapor deposition (CVD) method. In the example of FIG. 4, a case is shown in which the dielectric layer 12 is formed on the semiconductor substrate 200 first and then the sacrificial film layer 30 and the dielectric layer 12 are alternately stacked. By such a step, a stacked film (stacked body) is formed in which the sacrificial film layer 30 of each layer of the plurality of sacrificial film layers 30 and the dielectric layer 12 of each layer of the plurality of dielectric layers 12 are alternately stacked.

As a sacrificial film used for the sacrificial film layer 30, for example, a silicon nitride film (SiN film) is preferably used. In addition, as a dielectric film used for the dielectric layer 12, for example, a silicon oxide film ($SiO_2$ film) is preferably used. In addition, as a sacrificial film, for example, a silicon film or a silicon carbon nitride film (SiCN film) can also be used. As a sacrificial film, a material having an etching selectivity to both the dielectric layer 12 and the block dielectric film 28 in the replacement step (S116) described later is preferably used. Hereinafter, a case where a SiN film is used as a sacrificial film used for the sacrificial film layer 30 and a $SiO_2$ film is used as a dielectric film used for the dielectric layer 12 will be described. In addition, as the semiconductor substrate 200, for example, a silicon wafer having a diameter of 300 mm is used. In addition, other semiconductor elements such as dielectric films, wires, contacts, and/or transistors (not shown) may be formed on or in the semiconductor substrate 200 above which the sacrificial film layer 30 and the dielectric layer 12 are alternately stacked.

Figure 5:
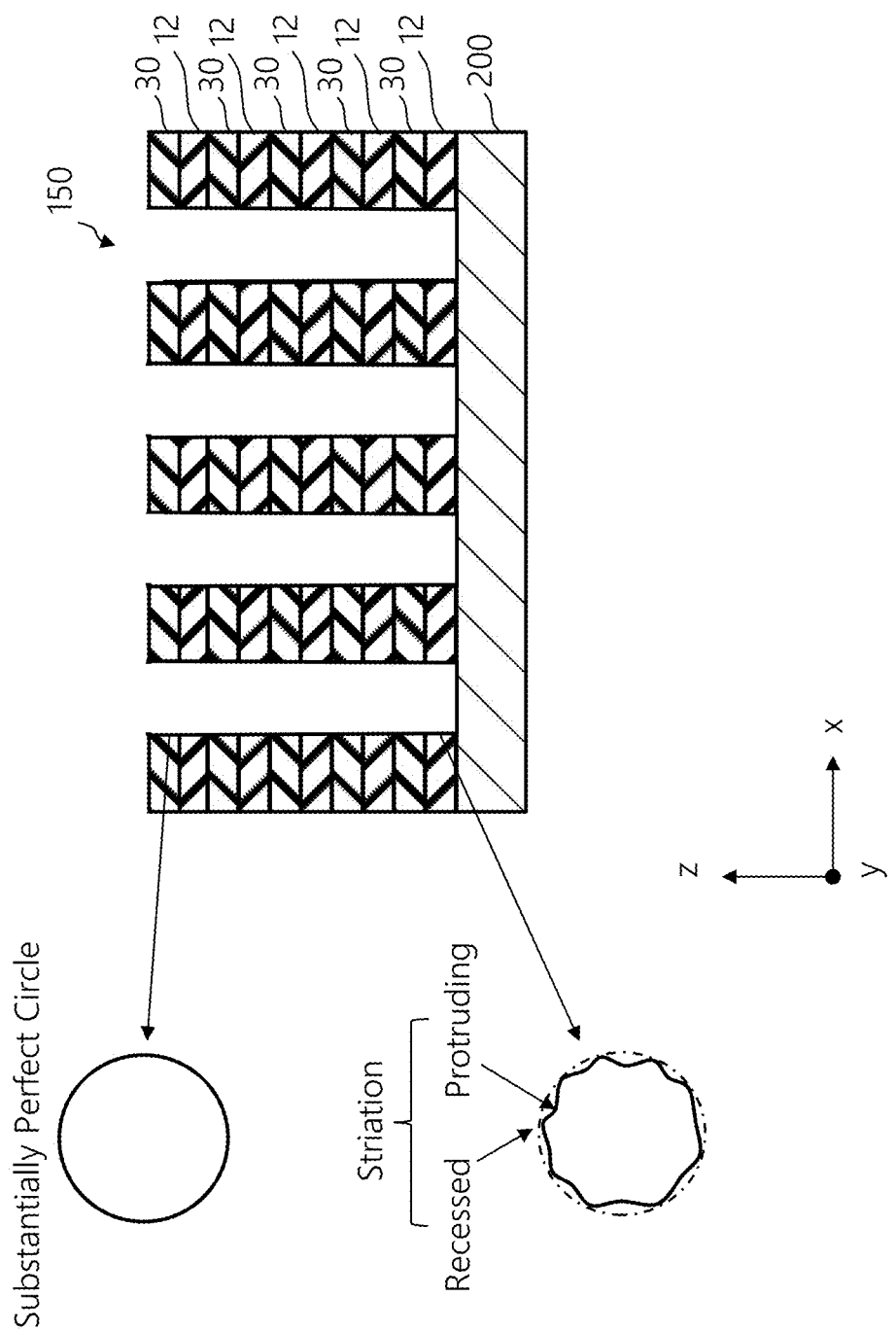
FIG. 5 is a cross-sectional view showing other steps of the method for fabricating the semiconductor device according to Embodiment 1.

FIG. 5 is a cross-sectional view showing other some of the steps of the method for fabricating the semiconductor device according to Embodiment 1. FIG. 5 shows the opening forming step (S104) in FIG. 3. Subsequent steps will be described later.

In FIG. 5, as the opening forming step (S104), a plurality of openings (memory holes 150) each having, for example, a circular cross section and penetrating the stacked film from above, for example, the sacrificial film layer 30 of the uppermost layer of the stacked film are formed.

Specifically, in a state in which a resist film is formed on the sacrificial film layer 30 through a lithography step such as a resist coating step and an exposure step (not shown), the exposed sacrificial film layer 30 and the stacked film of the sacrificial film layer 30 and the dielectric layer 12 located therebelow are removed by using an anisotropic etching method. As a result, the memory hole 150 can be formed substantially perpendicular to the surface of the sacrificial film layer 30. For example, the memory hole 150 may be formed by using a reactive ion etching (RIE) method. In addition, in Embodiment 1, the stacked film is formed so that the sacrificial film layer 30 of the sacrificial film layer 30 and the dielectric layer 12 is an exposed surface, and embodiments is not limited thereto. It is also preferable to form the stacked film so that the dielectric layer 12 is an exposed surface.

When such etching is performed, there is a problem that a portion locally etched in the circumferential direction, which is called a striation (vertical stripe portion), appears on the inner wall of the memory hole 150. The striation has a tendency that the difference between the maximum diameter and the minimum diameter increases toward the lower layer side. However, as shown in FIG. 2, a portion where no striation occurs may appear between portions where the striation occurs. In addition, the striation may also occur on the upper layer side. Here, in a portion where no striation occurs, an opening having a substantially perfect circular cross section of the memory hole 150 can be formed. In the portion where the striation occurs, the cross section of the memory hole 150 does not become a substantially perfect circle, and a plurality of protruding portions protruding inward with respect to a wall surface having a desired diameter and a plurality of recessed portions that do not protrude are formed.

When the block dielectric film 28 is formed in this state, the block dielectric film 28 is formed with a substantially constant film thickness according to the uneven shape of the striation. However, since the inner circumferential shape of the block dielectric film 28 becomes an uneven shape in this case, it becomes difficult to form the charge accumulation film 26 and the tunnel dielectric film 24 in a substantially perfect circle as well. In this case, unevenness reflecting the striation in the circumferential direction of the memory hole 150 remains on the channel body 21 to deteriorate the cell characteristics. In particular, the cell characteristics deteriorate because the electric field concentration occurs locally at the sharp points in the striation.

Therefore, in Embodiment 1, the high-k film 22 is embedded in the recessed portion of the uneven shape of the striation. Hereinafter, a specific description will be given.

Figure 6:
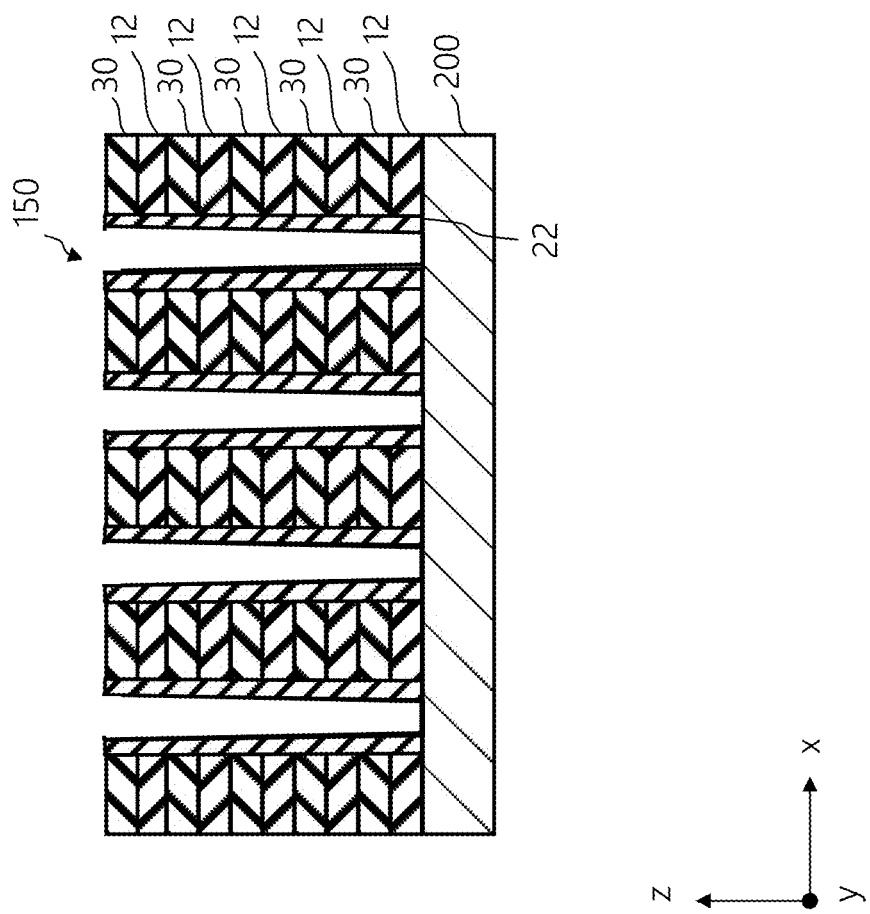
FIG. 6 is a cross-sectional view showing other steps of the method for fabricating the semiconductor device according to Embodiment 1.

FIG. 6 is a cross-sectional view showing other some of the steps of the method for fabricating the semiconductor device according to Embodiment 1. FIG. 6 shows the high-k film forming step (S106) in FIG. 3. Subsequent steps will be described later.

In FIG. 6, as the high-k film forming step (S106), the high-k film 22 is formed along the side wall surface of each memory hole 150 by using, for example, a CVD method. As a material of the high-k film 22, for example, at least one of aluminum oxide ($Al_2O_3$), zirconium oxide ($ZrO_2$), and hafnium oxide ($HfO_2$) is preferably used. Here, the high-k film 22 is formed thick with a film thickness in a range in which the recessed portion of the striation is completely embedded and the memory hole 150 is not completely embedded. In FIG. 6, the high-k film 22 formed on the sacrificial film layer 30 is not shown.

Figure 7:
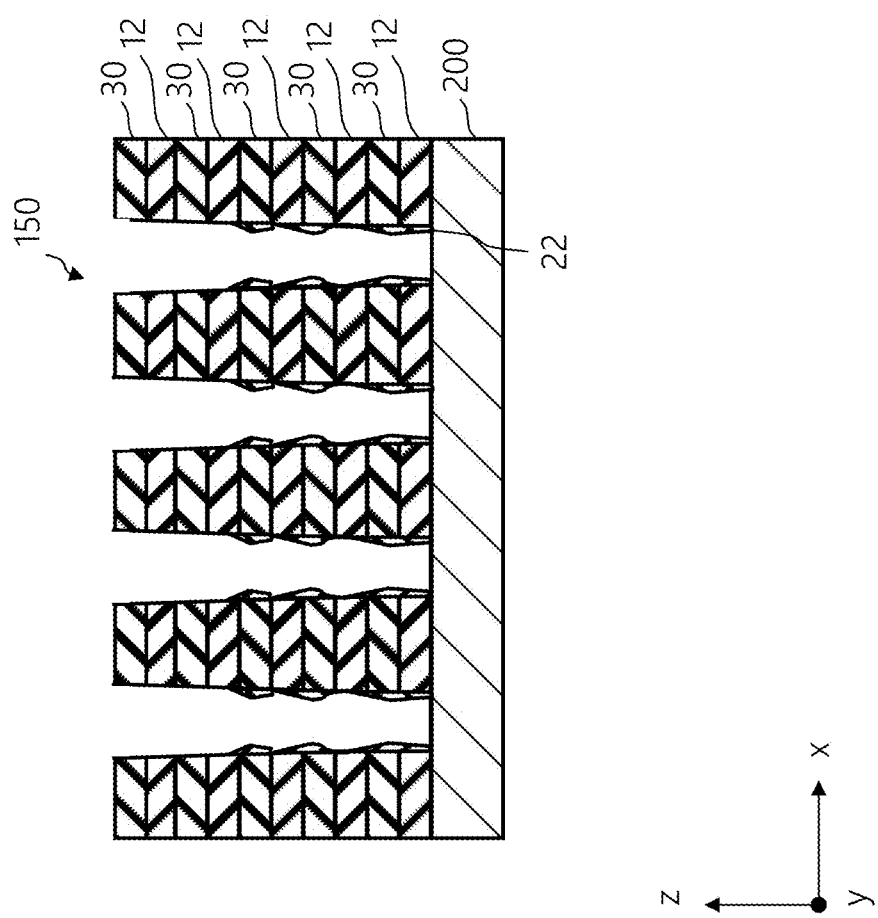
FIG. 7 is a cross-sectional view showing other steps of the method for fabricating the semiconductor device according to Embodiment 1.

FIG. 7 is a cross-sectional view showing other some of the steps of the method for fabricating the semiconductor device according to Embodiment 1. FIG. 7 shows the slimming step (S108) in FIG. 3. Subsequent steps will be described later.

In FIG. 7, as the slimming step (S108), the high-k film 22 formed with a thick film thickness is slimmed by using an isotropic etching method.

Figures 8A, 8B:
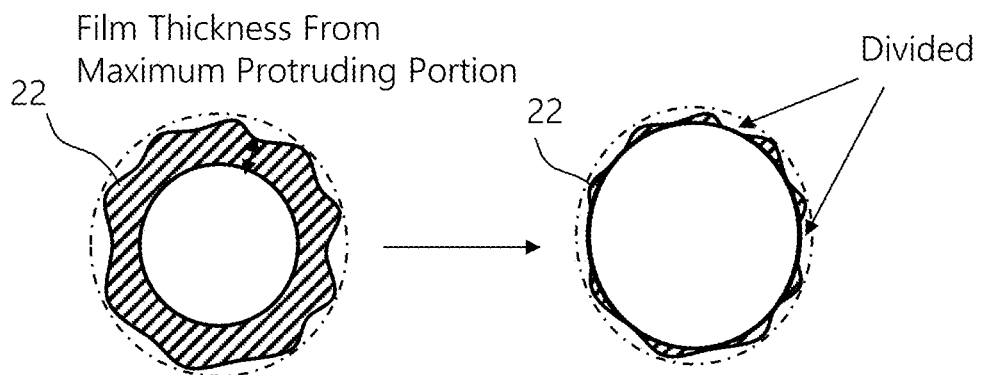
FIGS. 8A and 8B are diagrams showing an example before and after slimming of a high-k film in a portion where a striation occurs in Embodiment 1.

FIGS. 8A and 8B are diagrams showing an example before and after slimming of a high-k film in a portion where a striation occurs in Embodiment 1. As shown in FIG. 8A, at the point in time when the high-k film 22 is formed, the high-k film 22 is formed thick. By forming the high-k film 22 thick, the cross-sectional shape of the side wall surface of the hole after the high-k film 22 is formed approaches a perfect circle. In addition, in the portion where the striation occurs, by the slimming process from this state, the high-k film 22 is thinned to, for example, the position of the maximum protruding portion (the minimum radius portion in the circumferential direction of the memory hole 150 at each position in the z direction) of the striation as shown in FIG. 8B. As a result, the high-k film 22 has at least one portion divided in the circumferential direction. Since the striation appears on the inner side of a desired diameter region (dotted line) of the memory hole 150, etching at the position of the maximum protruding portion of the striation can theoretically be stopped, for example, by performing slimming by the film thickness of the high-k film 22 formed thick. In other words, etching can be stopped when the high-k film 22 is divided at some positions in the circumferential direction. In addition, the position where the slimming process is stopped is not limited to the maximum protruding portion of the striation. The position where the slimming process is stopped may be a protruding portion having the second largest size or less of the striation. Alternatively, a slimming error when slimming by the film thickness of the high-k film 22 may be checked by an experiment or the like, and the etching may be stopped at a position in consideration of the error. In this manner, the cross section of the memory hole 150 when viewed from the z direction can be made a substantially perfect circle.

Figures 9A, 9B:
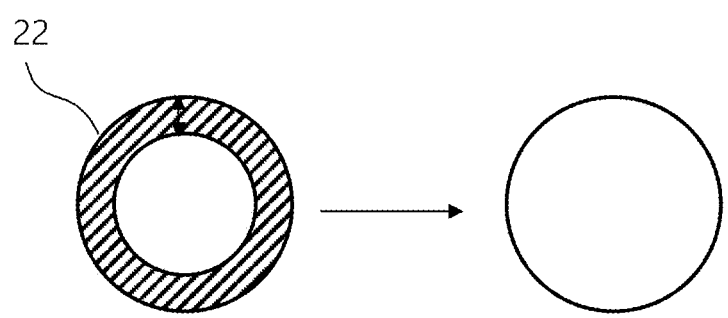
FIGS. 9A and 9B are diagrams showing an example before and after slimming of a high-k film in a portion where no striation occurs in Embodiment 1.

FIGS. 9A and 9B are diagrams showing an example before and after slimming of a high-k film in a portion where no striation occurs in Embodiment 1. As shown in FIG. 9A, at the point in time when the high-k film 22 is formed, the high-k film 22 is formed thick. In a portion where no striation occurs, the cross section of the memory hole 150 becomes a substantially perfect circle. Therefore, when the high-k film 22 is thinned by slimming to the position of the maximum protruding portion of the striation shown in FIG. 8B, the high-k film 22 disappears as shown in FIG. 9B.

Figures 10A, 10B:
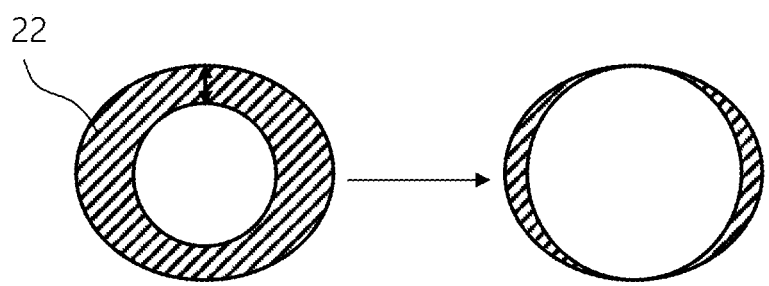
FIGS. 10A and 10B are diagrams showing an example before and after slimming of a high-k film in a portion where no striation occurs in a modification example of Embodiment 1.

FIGS. 10A and 10B are diagrams showing an example before and after slimming of a high-k film in a portion where no striation occurs in a modification example of Embodiment 1. FIGS. 10A and 10B show an example when the memory hole 150 is formed into an ellipse. As shown in FIG. 10A, at the point in time when the high-k film 22 is formed, the high-k film 22 is formed thick. By forming the high-k film 22 thick, the cross-sectional shape of the side wall surface of the hole after the high-k film 22 is formed approaches a perfect circle. In addition, in a portion where no striation occurs, the cross section of the memory hole 150 is an ellipse. Therefore, when the high-k film 22 is thinned by slimming to the position of the maximum protruding portion of the striation shown in FIG. 8B, the high-k film 22 remains in the major axis portion of the ellipse and the high-k film 22 in the minor axis portion disappears as shown in FIG. 10B. As a result, the cross section of the opening can be made substantially a perfect circle.

Figure 11:
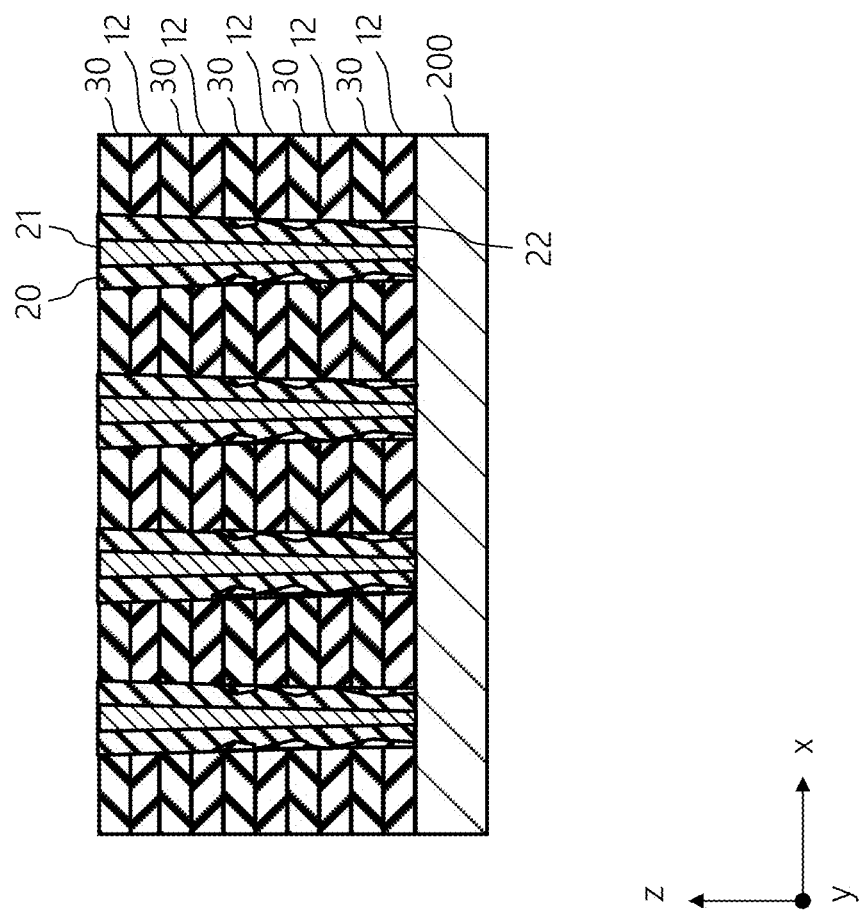
FIG. 11 is a cross-sectional view showing other steps of the method for fabricating the semiconductor device according to Embodiment 1.

FIG. 11 is a cross-sectional view showing other some of the steps of the method for fabricating the semiconductor device according to Embodiment 1. FIG. 11 shows the memory film forming step (S110) and the channel film forming step (S112) in FIG. 3. Subsequent steps will be described later.

In FIG. 11, as the memory film forming step (S110), the memory film 20 is formed in each memory hole 150. As shown in FIG. 1, the memory film 20 includes the block dielectric film 28, the charge accumulation film 26, and the tunnel dielectric film 24. Hereinafter, internal steps in the memory film forming step (S110) will be specifically described.

As a block film forming step, the block dielectric film 28 is formed along the side wall surface of each memory hole 150 by using, for example, the ALD method, the ALCVD method, or the CVD method. The block dielectric film 28 is a film for suppressing the flow of electric charges between the charge accumulation film 26 and the conductive layer 10. As a material of the block dielectric film 28, a material different from those of the sacrificial film layer 30 and the high-k film 22 is used. As a material of the block dielectric film 28, for example, $SiO_2$ is preferably used. The block dielectric film 28 has a function of covering and protecting the charge accumulation film 26, which is formed of the same material as the sacrificial film layer 30, during the replacement step (S116). In addition, as the block dielectric film 28, a material having high resistance to hot phosphoric acid is used. Then, the block dielectric film 28 arranged in a cylindrical shape along the side wall surface of the memory hole 150 can be formed as a part of the memory film 20.

The block dielectric film 28 is conformally formed with a desired film thickness so as to have a substantially constant film thickness. The unevenness generated by the striation of the side wall of the memory hole 150 is embedded with the high-k film 22. Therefore, the cross section of the memory hole 150 is formed in a substantially perfect circle. Thus, by forming the block dielectric film 28 conformally, the inner and outer circumferential cross sections of the block dielectric film 28 can be formed in a substantially perfect circle. Here, at the position where the high-k film 22 is formed, the insulating effect is obtained by the combination of the block dielectric film 28 and the high-k film 22. However, the combination of the block dielectric film 28 and the high-k film 22 can make the equivalent oxide thickness (EOT) smaller than that in a case where the portion where the high-k film 22 is formed is replaced with the $SiO_2$ film. Therefore, according to Embodiment 1, it is possible to prevent the insulating effect at the position where the high-k film 22 is formed from deviating from the insulating effect at the position where the high-k film 22 is not formed.

Then, as a charge accumulation film forming step, the charge accumulation film 26 is formed along the side wall surface of the block dielectric film 28 in each memory hole 150 by using, for example, the ALD method, the ALCVD method, or the CVD method. The charge accumulation film 26 is a film containing a material capable of storing electric charges. As the charge accumulation film 26, a charge trap film or a floating gate film is used. As a material of the charge accumulation film 26, for example, SiN is preferably used. In this case, the charge accumulation film 26 arranged in a cylindrical shape along the inner wall surface of the block dielectric film 28 can be formed as a part of the memory film 20. The charge accumulation film 26 is conformally formed with a desired film thickness. The inner circumferential cross section of the block dielectric film 28 is formed in a substantially perfect circle. Therefore, by forming the charge accumulation film 26 conformally, the inner and outer circumferential cross sections of the charge accumulation film 26 can be formed in a substantially perfect circle.

Then, as a tunnel dielectric film forming step, the tunnel dielectric film 24 is formed along the side wall surface of the charge accumulation film 26 in each memory hole 150 by using, for example, the ALD method, the ALCVD method, or the CVD method. The tunnel dielectric film 24 is a dielectric film that is insulating and allows a current to flow when a predetermined voltage is applied. As a material of the tunnel dielectric film 24, for example, $SiO_2$ or SiON is preferably used. Alternatively, a film formed by the combination of these materials may be used. In this case, the tunnel dielectric film 24 arranged in a cylindrical shape along the inner wall surface of the charge accumulation film 26 can be formed as a part of the memory film 20. The tunnel dielectric film 24 is conformally formed with a desired film thickness. The inner circumferential cross section of the charge accumulation film 26 is formed in a substantially perfect circle. Therefore, by forming the tunnel dielectric film 24 conformally, the inner and outer circumferential cross sections of the tunnel dielectric film 24 can be formed in a substantially perfect circle.

Then, as the channel film forming step (S112), a channel film serving as the channel body 21 is formed in a columnar shape along the inner wall surface of the tunnel dielectric film 24 in each memory hole 150 by using, for example, the ALD method, the ALCVD method, or the CVD method. As a material of the channel film, for example, a semiconductor material such as polysilicon or single crystal silicon is used. For example, it is preferable to use silicon doped with impurities. In this case, the channel body 21 can be formed in a columnar shape along the entire inner wall surface of the tunnel dielectric film 24.

Figure 12:
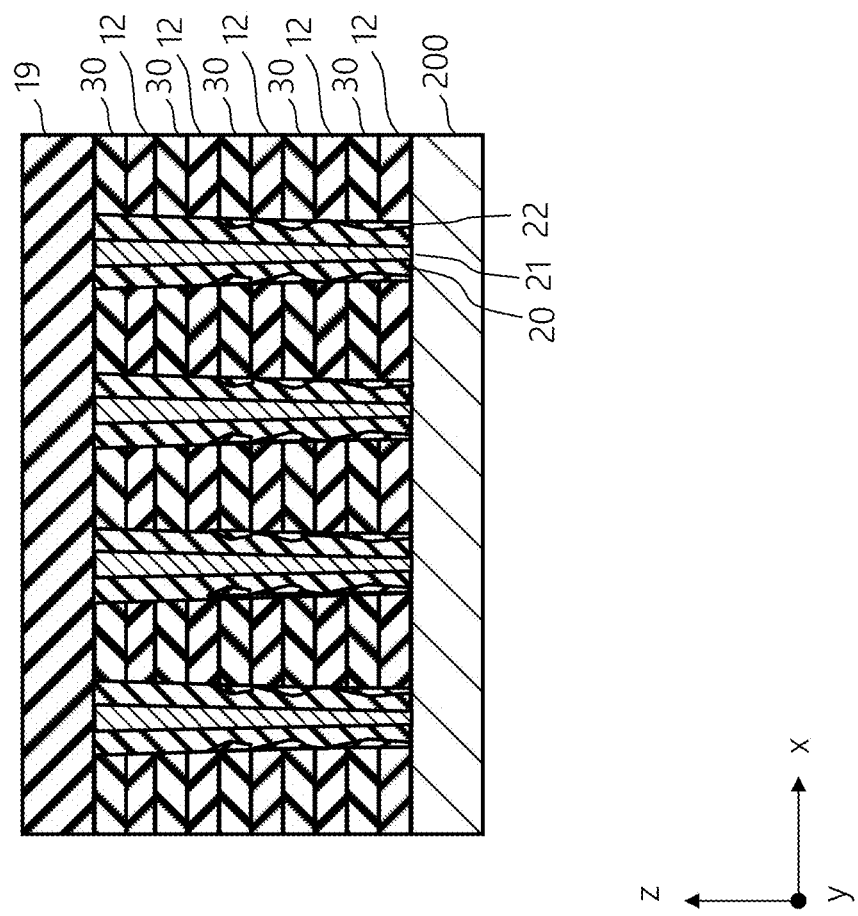
FIG. 12 is a cross-sectional view showing other steps of the method for fabricating the semiconductor device according to Embodiment 1.

FIG. 12 is a cross-sectional view showing other some of the steps of the method for fabricating a semiconductor device according to Embodiment 1. FIG. 12 shows the dielectric film forming step (S114) in FIG. 3. Subsequent steps will be described later.

In FIG. 12, as the dielectric film forming step (S114), the dielectric film 19 is formed on the stacked film in which the memory film 20 and the channel body 21 are formed by using, for example, the ALD method, the ALCVD method, or the CVD method. For example, as a material of the dielectric film 19, $SiO_2$ is preferably used.

Figure 13:
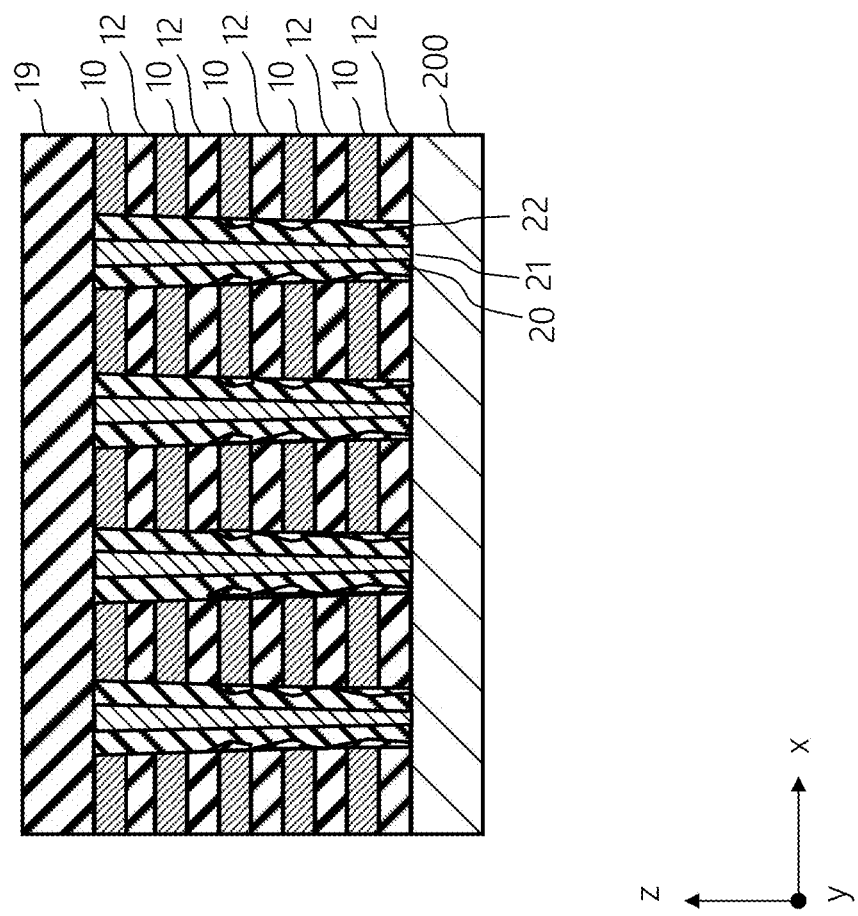
FIG. 13 is a cross-sectional view showing other steps of the method for fabricating the semiconductor device according to Embodiment 1.

FIG. 13 is a cross-sectional view showing other some of the steps of the method for fabricating a semiconductor device according to Embodiment 1. FIG. 13 shows the replacement step (S116) in FIG. 3.

In FIG. 13, as the replacement step (S116), the stacked sacrificial film layer 30 is replaced with the conductive layer 10. Specifically, the stacked sacrificial film layer 30 is replaced with the conductive layer 10 as follows. First, a replacement groove is formed in the stacked film of the dielectric film 19 and the sacrificial film layer 30 and the dielectric layer 12 located below the dielectric film 19 by using an anisotropic etching method. Then, the sacrificial film layer 30 of each layer is removed through the replacement groove by etching using a wet etching method (for example, hot phosphoric acid treatment). The replacement groove is formed on both sides of the stacked film shown in FIG. 13 in the x direction. By etching, a space is formed between the dielectric layers 12 of the respective layers. In the memory cell region, the memory film 20 and the channel body 21 extending in the stacking direction so as to cross the dielectric layer 12 of each layer serve as support members (pillars), so that it is possible to support the dielectric layer 12 of each layer so as not to collapse.

Then, an aluminum oxide ($Al_2O_3$) film is formed in the space between the dielectric layers 12 of the respective layers through the replacement groove by using the CVD method. As a result, the $Al_2O_3$ film is formed on the dielectric layer 12 of each layer exposed into the space and on the high-k film 22 or the memory film 20. In FIG. 13, as in FIG. 1, the $Al_2O_3$ film is not shown. Here, a zirconium oxide ($ZrO_2$) film and a hafnium oxide ($HfO_2$) film can also be used instead of the $Al_2O_3$ film.

Then, a conductive material serving as a word line is embedded in the space between the dielectric layers 12 of the respective layers through the replacement groove by using the CVD method, thereby forming the conductive layer 10. As a conductive material of the conductive layer 10, it is preferable to use tungsten (W), molybdenum (Mo), cobalt (Co), nickel (Ni), hafnium (Hf), platinum (Pt), titanium (Ti), or a combination thereof. Here, a case where W is used will be described. It is also preferable to first form a barrier metal film in the space between the dielectric layers 12 and then embed W. As described above, the memory cell region of the three-dimensional NAND flash memory device shown in FIG. 1 can be formed.

Figure 14:
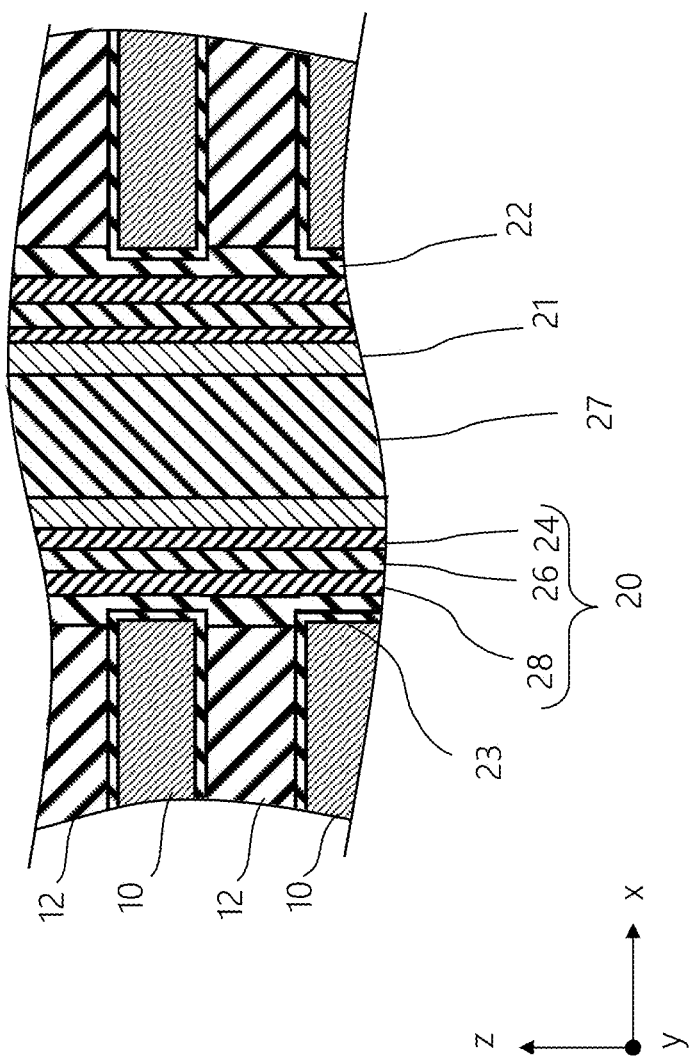
FIG. 14 is an enlarged view showing an example of a conductive layer and a dielectric layer adjacent to each other in Embodiment 1.

FIG. 14 is an enlarged view showing an example of a conductive layer and a dielectric layer adjacent to each other in Embodiment 1. In addition, in the example of FIG. 14, a case where a core part 27 using, for example, a dielectric material is arranged inside the channel body 21 is shown. In the replacement step (S116), the sacrificial film layer 30 is removed by, for example, hot phosphoric acid. When aluminum oxide is used as the high-k film 22, the aluminum oxide is etched by phosphoric acid. However, the etching rate is slower than that of the sacrificial film layer 30. For this reason, when removing the sacrificial film layer 30, a part of the high-k film 22 exposed to the stacking-direction position corresponding to the sacrificial film layer 30 is removed by etching. As a result, as shown in FIG. 14, the film thickness of the high-k film 22 formed between the conductive layer 10 and the memory film 20 at the recessed portion of the striation is smaller than the film thickness of the high-k film 22 arranged between the dielectric layer 12 and the memory film 20 adjacent to each other in the stacking direction.

In addition, the resistance to hot phosphoric acid herein is higher in the order of the block dielectric film 28, the high-k film 22, and the sacrificial film layer 30. For this reason, when removing the sacrificial film layer 30 by hot phosphoric acid, the block dielectric film 28 exposed to the protruding portion of the striation also has a function of protecting the charge accumulation film 26 from the hot phosphoric acid and accordingly, unlike the high-k film 22, there is almost no retreat.

Figure 15A:
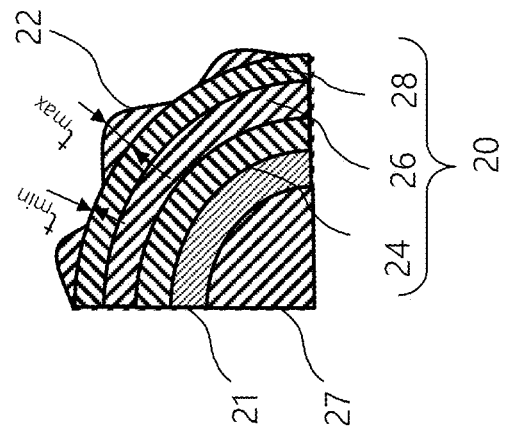
FIGS. 15A and 15B are diagrams showing an example of a memory pillar cross section in a conductive layer and a memory pillar cross section in a dielectric layer in Embodiment 1.
Figure 15B:
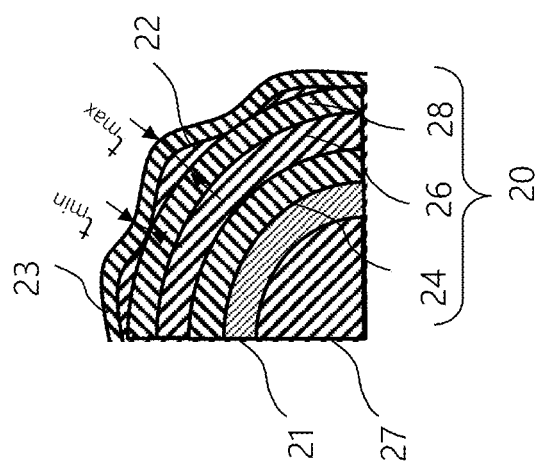

FIGS. 15A and 15B are diagrams showing an example of a memory pillar cross section in a conductive layer and a memory pillar cross section in a dielectric layer in Embodiment 1. FIGS. 15A and 15B both show cross sections viewed from above (z direction). FIG. 15A shows an example of the cross section of the memory pillar at the stacking-direction position corresponding to the conductive layer 10. FIG. 15B shows an example of the cross section of the memory pillar at the stacking-direction position corresponding to the dielectric layer 12. In the replacement step (S116), after removing the sacrificial film layer 30, an $Al_2O_3$ film 23 is formed in the space before embedding the conductive material. At this time, the $Al_2O_3$ film 23 is conformally formed with a substantially uniform film thickness in the circumferential direction surrounding the memory film 20.

The $Al_2O_3$ film 23 is arranged between the conductive layer 10 and the memory film 20 in a portion where the high-k film 22 is divided. The $Al_2O_3$ film 23 is arranged between the conductive layer 10 and the high-k film 22 in a portion where the high-k film 22 is arranged. In other words, in the portion where the high-k film 22 is divided, the $Al_2O_3$ film 23 is not arranged between the plurality of dielectric layers 12 and the memory film 20, and is arranged between the plurality of conductive layers 10 and the memory film 20. In a portion where the high-k film 22 is arranged, the $Al_2O_3$ film 23 is not arranged between the plurality of dielectric layers 12 and the high-k film 22, and is arranged between the plurality of conductive layers 10 and the high-k film 22.

When the high-k film 22 is partially divided in the circumferential direction as shown in FIG. 15A, electric charges may be transferred from the conductive layer 10 to the charge accumulation film 26 through the block dielectric film 28 during the operation of the memory cell. For this reason, by forming the $Al_2O_3$ film 23, the divided portion of the high-k film 22 can be embedded with another high-k member. In this viewpoint, the divided portion of the high-k film 22 may be embedded with another high-k film including a high-k material different from $Al_2O_3$, for example, $ZrO_2$ or $HfO_2$ so that electric charges from the conductive layer 10 can be blocked. Therefore, not only in the portion where the high-k film 22 is divided but also at the stacking-direction position where the memory hole 150 is processed into a substantially perfect circular cross-sectional shape and the high-k film 22 disappears, it is possible to suppress the flow of electric charges between the charge accumulation film 26 and the conductive layer 10 due to the $Al_2O_3$ film 23 and the like. In addition, by arranging the $Al_2O_3$ film 23 between the conductive layer 10 and the block dielectric film 28, it is possible to particularly reduce the electric field concentration at the corner of the conductive layer 10, which may cause a phenomenon in which electric charges flow from the conductive layer 10 to the charge accumulation film 26.

Here, when $Al_2O_3$ is used as a material of the high-k film 22, the high-k film 22 and the $Al_2O_3$ film 23 are formed of the same material. Therefore, as shown in FIG. 15A, the $Al_2O_3$ film thickness at the stacking-direction position corresponding to the conductive layer 10 is the total film thickness of the high-k film 22 and the $Al_2O_3$ film 23. On the other hand, at each position of the conductive layer 10 and the dielectric layer 12 adjacent to each other as described above, the film thickness of the high-k film 22 at the stacking-direction position corresponding to the conductive layer 10 is smaller than the film thickness of the high-k film 22 at the stacking-direction position corresponding to the dielectric layer 12. Similarly for the high-k film 22 at the maximum recessed portion of the striation, the film thickness of the high-k film 22 at the stacking-direction position corresponding to the conductive layer 10 is smaller than the film thickness of the high-k film 22 at the stacking-direction position corresponding to the dielectric layer 12. For this reason, regarding the $Al_2O_3$ film thickness at each position of the conductive layer 10 and the dielectric layer 12 adjacent to each other, the difference between the maximum film thickness tmax and the minimum film thickness tmin in the circumferential direction of the memory pillars shown in FIGS. 15A and 15B is smaller at the stacking-direction position corresponding to the conductive layer 10 than at the stacking-direction position corresponding to the dielectric layer 12. Thus, particularly for the film thickness of $Al_2O_3$ arranged between the conductive layer 10 and the memory film 20, the difference between the maximum film thickness and the minimum film thickness in the circumferential direction surrounding the memory film 20 is reduced. For this reason, the film thickness of the high-k film 22 (or the total film thickness of the high-k film 22 and the $Al_2O_3$ film 23) can be made more uniform than at the position of the dielectric layer 12. Therefore, it is possible to reduce the variation in the insulation performance between the charge accumulation film 26 and the conductive layer 10. As a result, it is possible to suppress the deterioration of cell characteristics.

Figure 16:
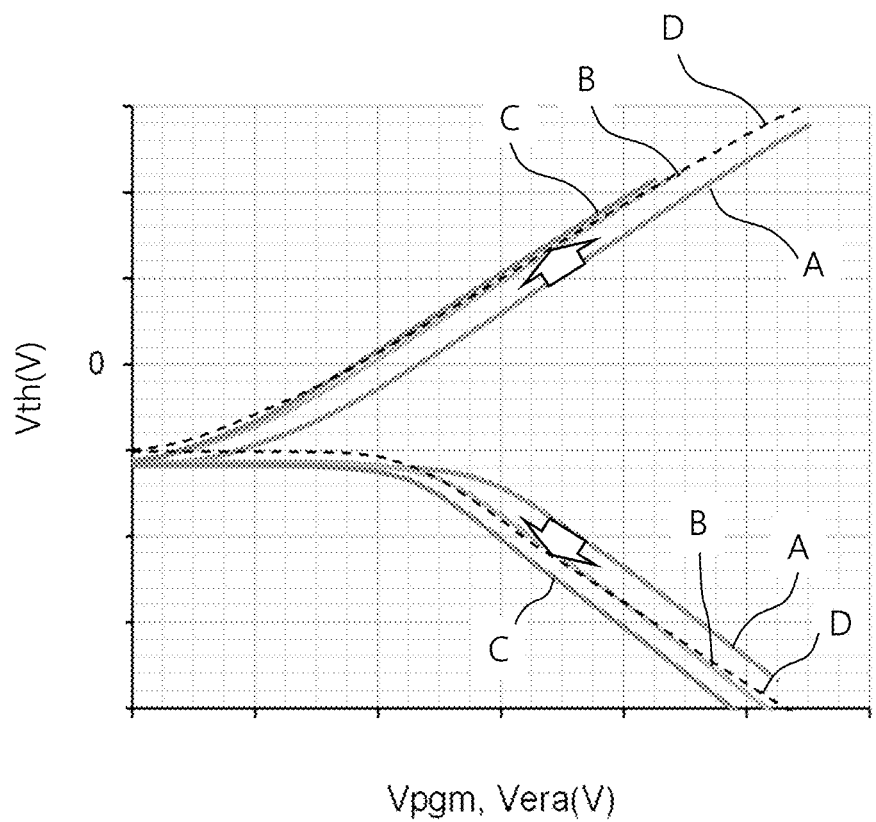
FIG. 16 is a diagram showing an example of the cell characteristics in Embodiment 1.

FIG. 16 is a diagram showing an example of the cell characteristics in Embodiment 1. In FIG. 16, the vertical axis indicates a threshold voltage Vth. The horizontal axis indicates a writing voltage Vpgm and an erasing voltage Vera. Comparative Example 1 (graph D) shows a case where no striation occurs, the cross section of the memory hole is substantially a perfect circle, and the block dielectric film is formed of $SiO_2$. On the other hand, Comparative Example 2 (graph A) shows a case where a striation occurs and $SiO_2$ is embedded in a portion where the inner wall surface is substantially a perfect circle and a recessed portion of the striation on the outer side thereof. In Comparative Example 2, the charge accumulation film, the tunnel dielectric film, and the channel film are formed so that their cross sections are substantially perfect circles. However, in Comparative Example 2, the film thickness of the block dielectric film formed of $SiO_2$ is large at the recessed portion of the striation, and is not substantially constant in the circumferential direction. For this reason, in Comparative Example 2, the threshold voltage at the time of writing is lower than that in Comparative Example 1. On the contrary, in Comparative Example 2, the threshold voltage at the time of erasing is higher than that in Comparative Example 1. Thus, even if the charge accumulation film, the tunnel dielectric film, and the channel film can be formed so that their cross sections are substantially perfect circles, the cell characteristics deteriorate because the film thickness of the block dielectric film is not substantially constant in the circumferential direction.

On the other hand, in Embodiment 1, a recessed portion on the wall surface of the memory hole 150 in which a striation occurs is embedded with the high-k film 22, and the block dielectric film 28 having a substantially perfect circular cross section is formed inside the high-k film 22 with a substantially constant film thickness. In the configuration of Embodiment 1, the same writing characteristics as in Comparative Example 1 can be obtained in both a case where the dielectric constant k of the high-k film 22 is 10 (graph B) and a case where the dielectric constant k of the high-k film 22 is 25 (graph C). In addition, in Embodiment 1, when the dielectric constant k is 10 (graph B), the same erasing characteristics as in Comparative Example 1 can be obtained. In addition, in Embodiment 1, when the dielectric constant k is 25 (graph C), the threshold voltage at the time of erasing can be made lower than that in Comparative Example 1.

When the high-k film 22 is embedded in the recessed portion of the striation as in Embodiment 1, the EOT in the recessed portion of the striation can be made smaller than in the case of Comparative Example 2. For this reason, it is possible to approach the $SiO_2$ film thickness in Comparative Example 1. Therefore, as shown in FIG. 16, in the examples (graph B and graph C) of Embodiment 1, the writing and erasing speeds of concern in Comparative Example 2 can be improved. In addition, compared with the case of Comparative Example 2 (graph A), the characteristic difference from the case of Comparative Example 1 (graph D) can be reduced. Therefore, it is possible to suppress deterioration of a variation in the threshold voltage Vth at the time of writing at a predetermined writing voltage Vpgm.

Figure 17:
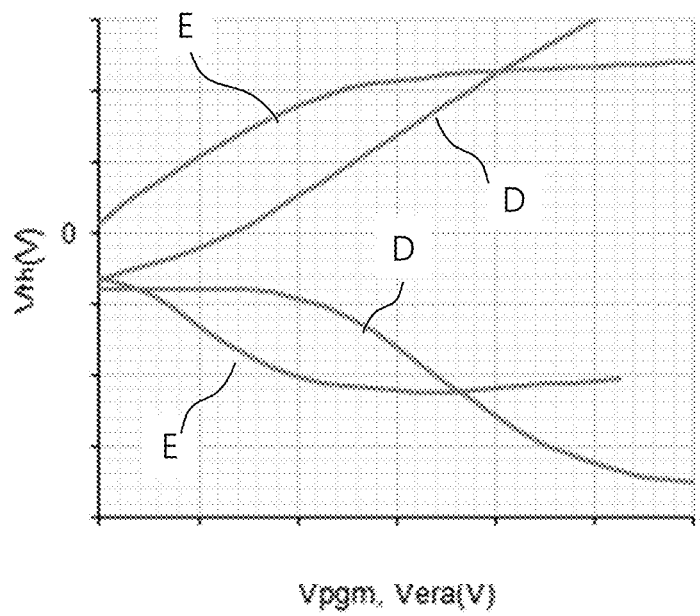
FIG. 17 is a diagram showing another example of the cell characteristics in Embodiment 1.

FIG. 17 is a diagram showing another example of the cell characteristics in Embodiment 1. In FIG. 17, the vertical axis indicates the threshold voltage Vth. The horizontal axis indicates a writing voltage Vpgm and an erasing voltage Vera. In FIG. 17, the values on the horizontal axis do not match those in FIG. 16. FIG. 17 shows Comparative Example 1 (graph D) in which no striation occurs, the cross section of the memory hole is substantially a perfect circle, and the block dielectric film is formed of $SiO_2$ and Comparative Example 3 (graph E) in which no striation occurs, the cross section of the memory hole is substantially a perfect circle, and the block dielectric film is formed of $Al_2O_3$.

When the block dielectric film is formed of $Al_2O_3$, the EOT is reduced to 40% of that when the block dielectric film is formed of $SiO_2$. In addition, when the block dielectric film is formed of $Al_2O_3$, the difference in electron barrier from the charge accumulation film is smaller than that when the block dielectric film is formed of $SiO_2$. For this reason, at the same film thickness, electric charges are more likely to leak from the charge accumulation film when the block dielectric film is formed of $Al_2O_3$. As a result, in Comparative Example 3, in the writing characteristics, the threshold voltage at a low writing voltage is high, and writing to the higher threshold voltage is difficult. In addition, in the erasing characteristics, the threshold voltage at a low erasing voltage is low, and erasing up to the lower threshold voltage is difficult. In addition, when the block dielectric film is formed of $Al_2O_3$, more defects (traps) are likely to occur than when the block dielectric film is formed of $SiO_2$. For this reason, when the block dielectric film is formed so that $Al_2O_3$ alone has a predetermined film thickness, there is a high possibility that further defects will occur. Therefore, by forming the block dielectric film 28 having a substantially perfect circular cross section with $SiO_2$ or the like and forming the high-k film 22 in the recessed portion of the striation as in Embodiment 1, writing to a high threshold voltage is possible. In addition, erasing up to a low threshold voltage is possible.

As described above, according to Embodiment 1, it is possible to suppress the deterioration of the cell characteristics even when a striation occurs during the processing of a memory hole.

The embodiments have been described above with reference to specific examples. However, embodiments are not limited to these specific examples. For example, the memory pillar may have a 2-tier structure in which memory holes formed in the lower stacked body and the upper stacked body, which are stacked in two stages, are connected to each other in the z direction and the channel body 21 and the memory film 20 are provided in the connected memory holes. In addition, the memory pillar may have a bowing shape with an increased diameter at a predetermined height position between the top surface and the bottom surface other than a tapered shape in which the diameter of the bottom surface is smaller than that of the top surface as shown in FIG. 2.

In addition, in the example of FIG. 1, the memory cell region is arranged on the semiconductor substrate 200, such as a silicon wafer. However, the stacked body including the memory cell region and the word line contact region may be stacked above the peripheral circuit arranged on the substrate, or may be bonded to the substrate on which the peripheral circuit is arranged.

In addition, for the film thickness of each film, the size and shape of the opening, the number of openings, and the like, those required for semiconductor integrated circuits and various semiconductor elements can be appropriately selected and used.

In addition, all semiconductor devices, which include the elements of embodiments and can be appropriately redesigned by those skilled in the art, and a method for fabricating the same are included in the scope of embodiments.

In addition, for the sake of simplification of the explanation, methods usually used in the semiconductor industry, such as a photolithography process and cleaning before and after processing, are omitted, and it is needless to say that these methods can be included.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a plurality of conductive layers stacked apart from each other and extending in a plate shape in a direction crossing a stacking direction;
   a channel body including a semiconductor film and penetrating the plurality of conductive layers;
   a tunnel dielectric film provided on an outer circumferential side of the channel body;
   a charge accumulation film provided on an outer circumferential side of the tunnel dielectric film;
   a block dielectric film provided on an outer circumferential side of the charge accumulation film; and
   a first high dielectric constant (high-k) film provided on an outer circumference side of the block dielectric film, and arranged between the plurality of conductive layers and the block dielectric film while being divided in a circumferential direction surrounding the block dielectric film, a dielectric constant of the first high-k film being higher than that of the block dielectric film.

2. The device according to claim 1,
   wherein the charge accumulation film is conformally formed.

3. The device according to claim 1,
   wherein at least one of aluminum oxide, zirconium oxide, and hafnium oxide is used as a material of the first high-k film.

4. The device according to claim 1,
   wherein silicon oxide is used as a material of the block dielectric film.

5. The device according to claim 1,
   wherein the block dielectric film is conformally formed.

6. The device according to claim 1, further comprising:
   a second high-k film arranged between the plurality of conductive layers and the first high-k film in a portion where the first high-k film is arranged and arranged between the plurality of conductive layers and the block dielectric film in a portion where the first high-k film is divided.

7. The device according to claim 6,
wherein the second high-k film is conformally formed in a circumferential direction surrounding the block dielectric film.

8. The device according to claim 6,
wherein at least one of aluminum oxide, zirconium oxide, and hafnium oxide is used as a material of the second high-k film.

9. The device according to claim 1, further comprising:
a plurality of dielectric layers arranged between conductive layers adjacent to each other in the stacking direction among the plurality of conductive layers,
wherein the channel body penetrates the plurality of dielectric layers,
the block dielectric film is provided between the plurality of dielectric layers and the channel body, and
the first high-k film is arranged between the plurality of dielectric layers and the block dielectric film while being divided in the circumferential direction surrounding the block dielectric film.

10. The device according to claim 9, further comprising:
a second high-k film not arranged between the plurality of dielectric layers and the first high-k film and arranged between the plurality of conductive layers and the first high-k film in a portion where the first high-k film is arranged.

11. The device according to claim 10,
wherein, in a portion where the first high-k film is divided, the second high-k film is not arranged between the plurality of dielectric layers and the block dielectric film and is arranged between the plurality of conductive layers and the block dielectric film.

12. The device according to claim 1, further comprising:
a core part including a dielectric material arranged inside the channel body.

13. A semiconductor device, comprising:
a plurality of conductive layers stacked apart from each other and extending in a plate shape in a direction crossing a stacking direction;
a plurality of dielectric layers arranged between conductive layers adjacent to each other in the stacking direction among the plurality of conductive layers;
a channel body including a semiconductor film and penetrating a stacked film of the plurality of conductive layers and the plurality of dielectric layers;
a memory film including a charge accumulation film and provided between the stacked film and the channel body; and
a high dielectric constant (high-k) film provided between the stacked film and the memory film, a difference between a maximum film thickness and a minimum film thickness of the high-k film in a circumferential direction surrounding the memory film being smaller at a stacking-direction position corresponding to a conductive layer than at a stacking-direction position corresponding to a dielectric layer of respective positions in the stacking direction corresponding to the conductive layer and the dielectric layer adjacent to each other in the stacked film of the plurality of conductive layers and the plurality of dielectric layers.

14. The device according to claim 13,
wherein the high-k film is arranged while being divided in the circumferential direction surrounding the memory film.

15. The device according to claim 13,
wherein the charge accumulation film is conformally formed.

16. The device according to claim 15,
wherein the memory film further includes a block dielectric film conformally formed on an outer circumferential side of the charge accumulation film.

17. The device according to claim 13,
wherein at least one of aluminum oxide, zirconium oxide, and hafnium oxide is used as a material of the high-k film.

18. The device according to claim 13,
wherein the high-k film is not arranged on an upper layer side and is arranged on a lower layer side.

19. The device according to claim 1,
wherein a cross section of the block dielectric film is a substantially perfect circle.

* * * * *